United States Patent [19]

Tam

[11] Patent Number: 5,126,686
[45] Date of Patent: Jun. 30, 1992

[54] RF AMPLIFIER SYSTEM HAVING MULTIPLE SELECTABLE POWER OUTPUT LEVELS

[75] Inventor: Ambrose W. C. Tam, Taipo, Hong Kong

[73] Assignee: Astec International, Ltd., Hong Kong

[21] Appl. No.: 394,206

[22] Filed: Aug. 15, 1989

[51] Int. Cl.⁵ .............................................. H03G 3/20
[52] U.S. Cl. .................................. 330/134; 330/279; 455/116; 455/126
[58] Field of Search ................ 330/134, 279; 455/116, 455/117, 126

[56] References Cited

U.S. PATENT DOCUMENTS

| | | | |
|---|---|---|---|
| 4,057,765 | 11/1977 | Schuermann | 330/279 |
| 4,147,991 | 1/1979 | Ijichi et al. | 330/279 |
| 4,450,413 | 5/1984 | Fujibayashi | 330/279 |
| 4,499,430 | 2/1985 | Fujii | 330/279 |
| 4,523,155 | 6/1985 | Walczak et al. | 330/279 |
| 4,528,519 | 7/1985 | Van Driest | 330/279 |
| 4,602,218 | 7/1986 | Vilmur et al. | 330/279 |

FOREIGN PATENT DOCUMENTS 152734  9/1982  Japan .................................. 455/116

*Primary Examiner*—James B. Mullins
*Attorney, Agent, or Firm*—McCubbrey, Bartels, Meyer & Ward

[57] ABSTRACT

A control circuit for a radio frequency (rf) amplifier having multiple selectable power output levels in response to a plurality of input control signals is presented. The rf amplifier includes a variable gain input which is responsive to the control circuit. The control circuit includes an attenuator coupled to the output of the rf amplifier for providing an attenuated rf signal and an detector coupled to the output of the attenuator for generating a DC output signal which is substantially linearly related to the magnitude of the rf signal output by the rf amplifier. The control circuit also includes a means coupled to the input control signals for selecting one of a plurality of amplification factors. An amplifier is used to amplify the DC output signal generated by the detector using the selected amplification factors. The amplified output is coupled to the variable gain input of the rf amplifier.

14 Claims, 7 Drawing Sheets

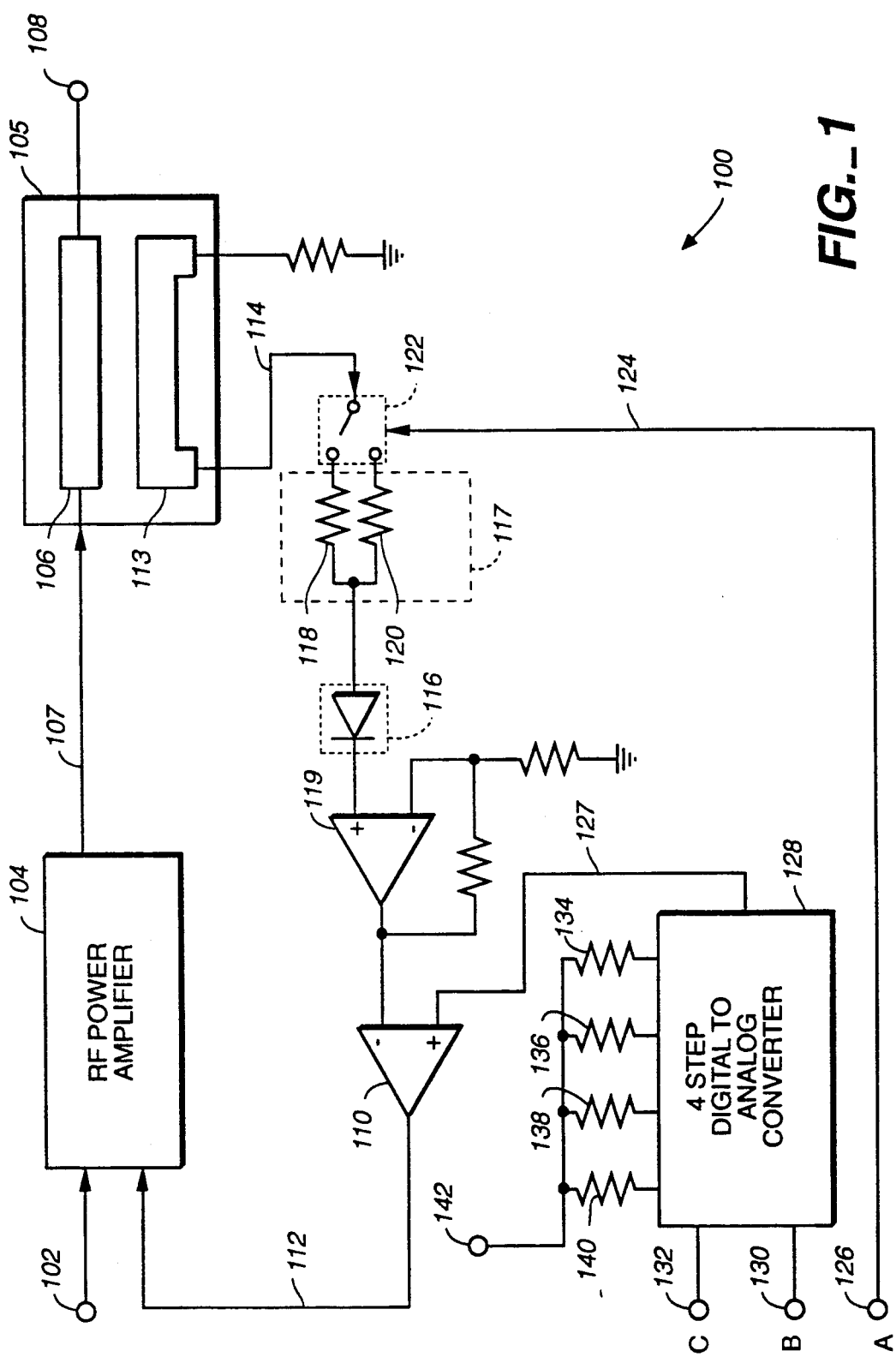
FIG._1

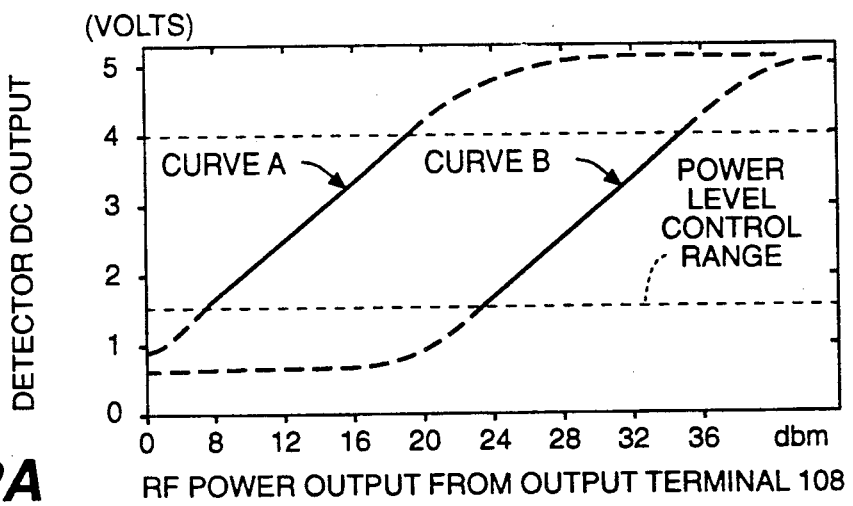
FIG._2A
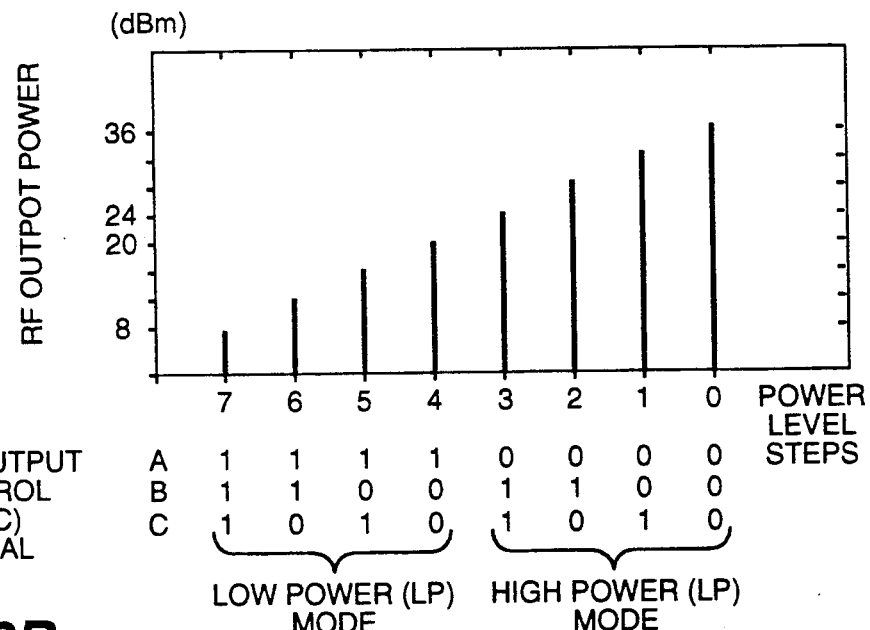
FIG._2B
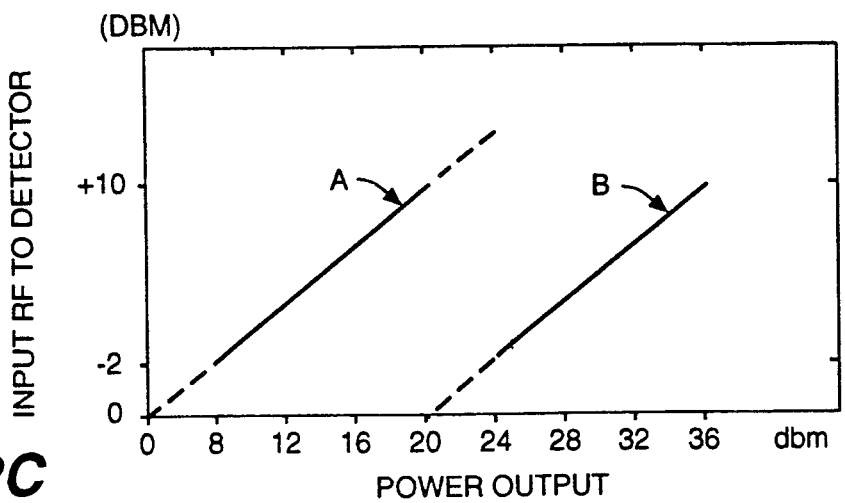
FIG._2C

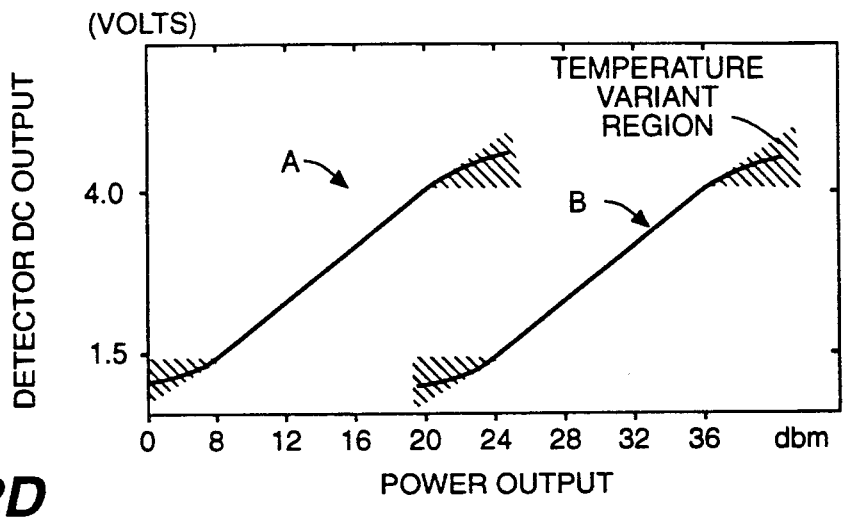
FIG._2D
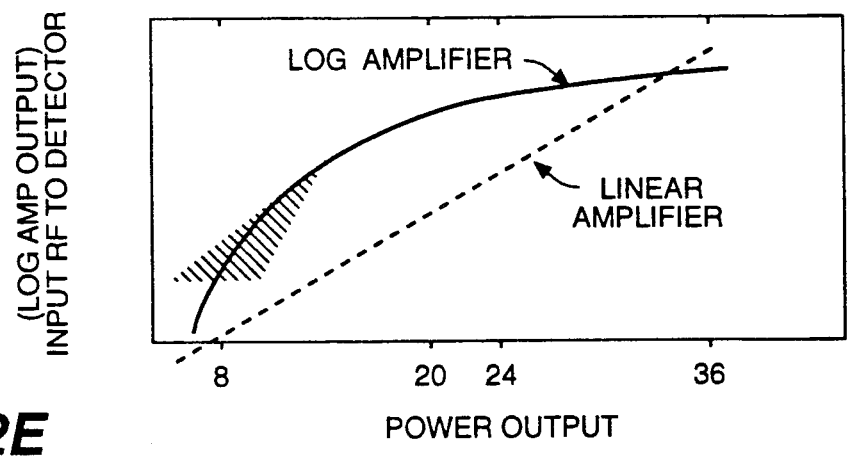
FIG._2E
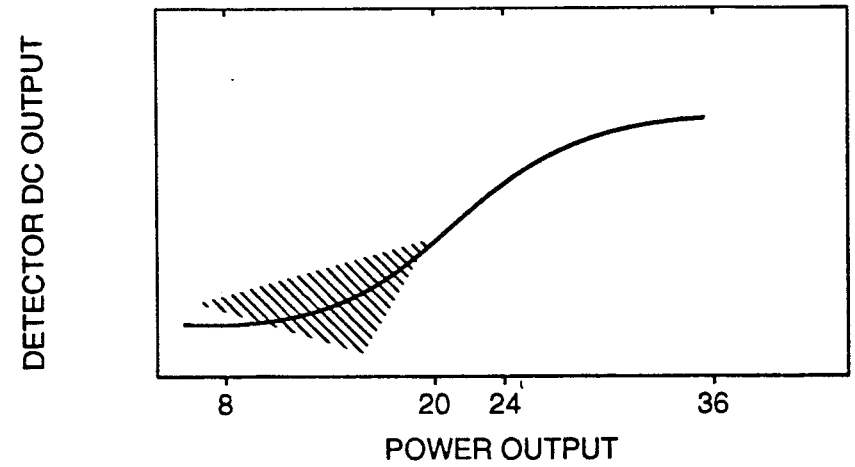
FIG._2F

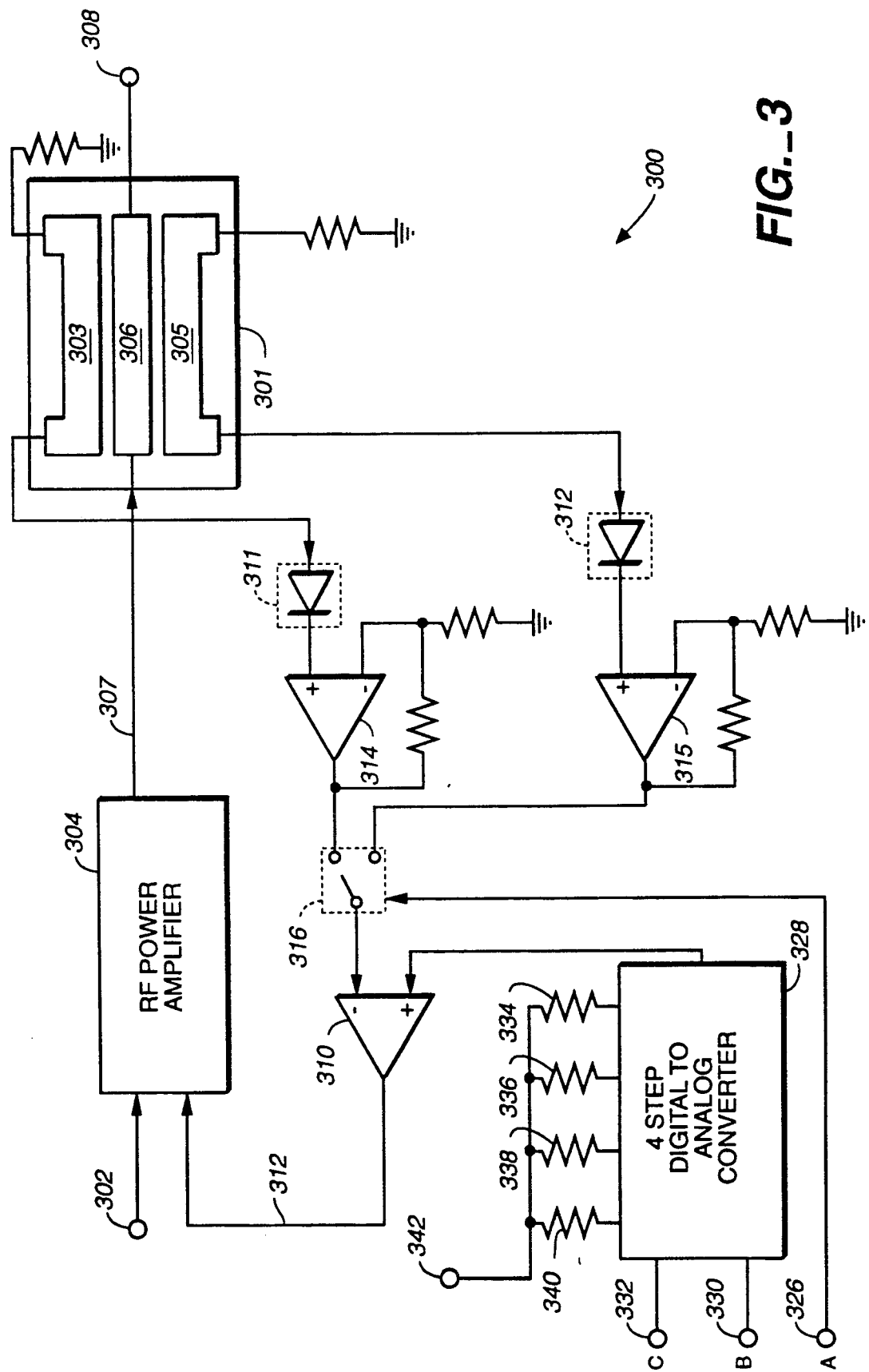

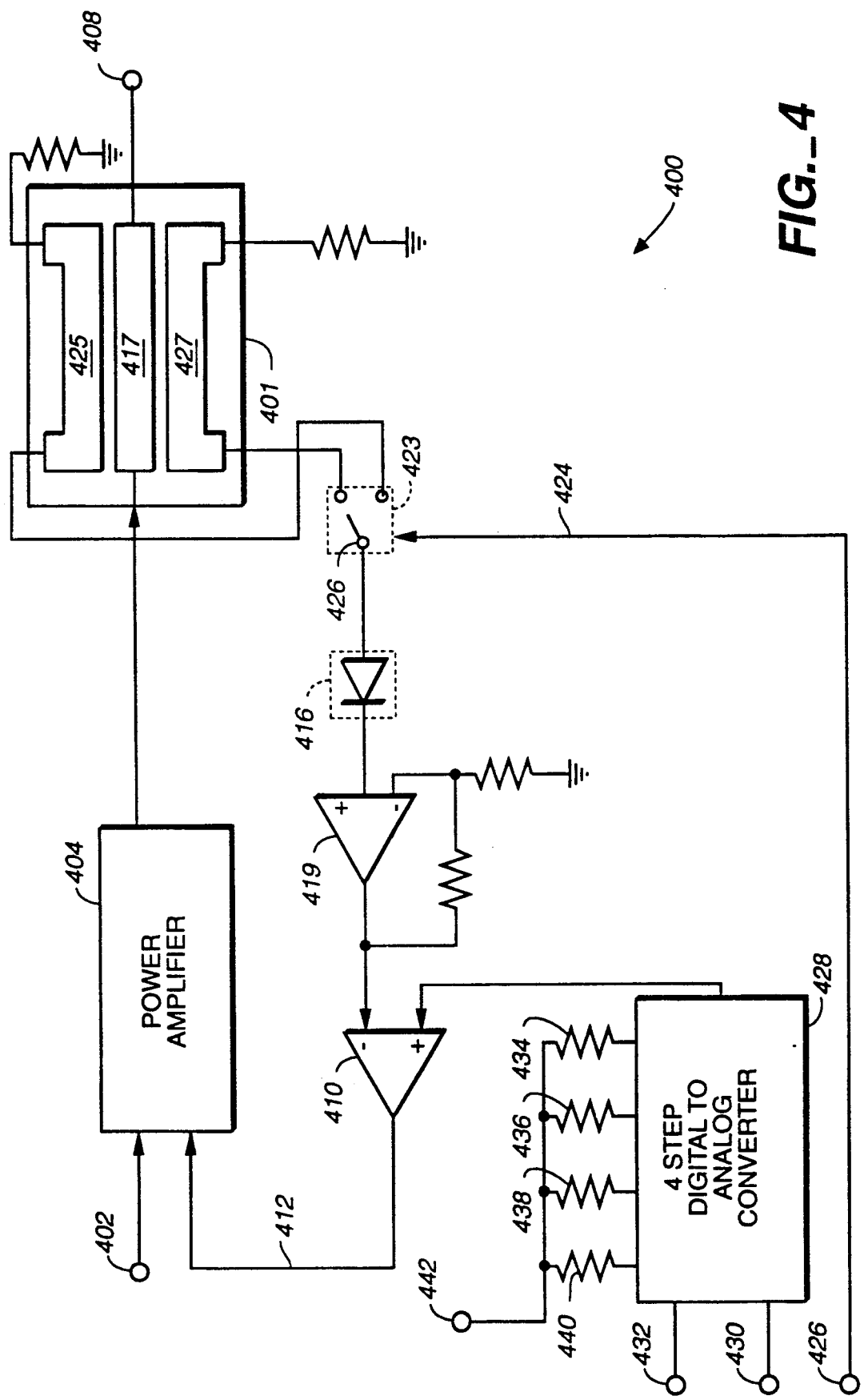
FIG._4

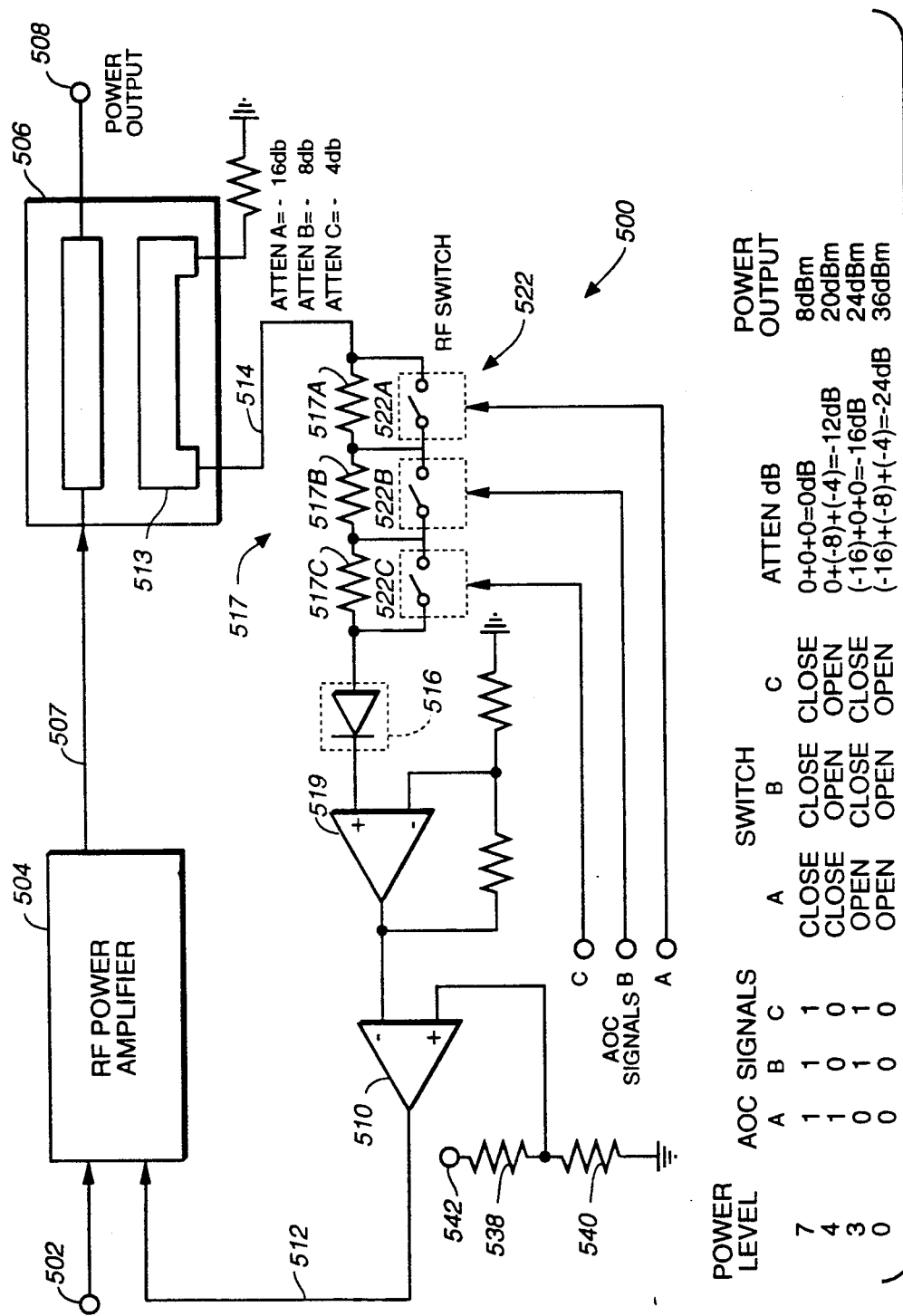
FIG._5

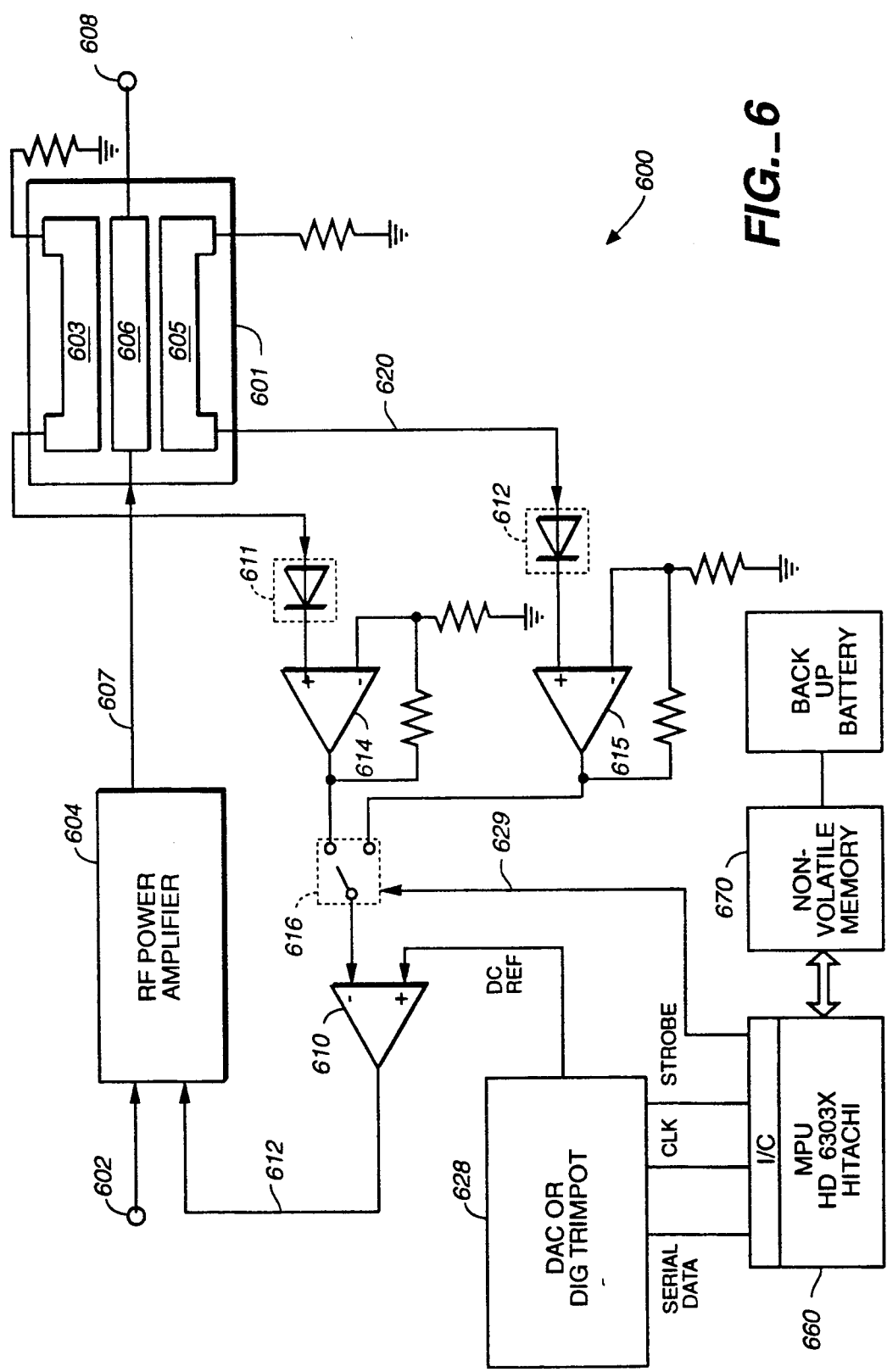
FIG._6

RF AMPLIFIER SYSTEM HAVING MULTIPLE SELECTABLE POWER OUTPUT LEVELS

FIELD OF THE INVENTION

This invention relates to the field of radio frequency power amplifiers and more specifically to a radio frequency (RF) power amplifier having multiple selectable power output levels which is adapted for use with mobile transceivers and the like.

BACKGROUND OF THE INVENTION

Recently, radio communication systems have been developed which employ transmitters with variable output power. Variable power systems are advantageous in systems with a large number of channels and users. One example of this type of system currently being implemented in the United States. In this type of system, a geographic area is divided into a number of "cells" wherein users in any particular cell may be assigned any of a number of frequencies. As a particular user moves closer or further away from a particular cell controller, the cell controller reduces or increases the power of the mobile transmitter. The output power of the mobile transmitter is maintained at whatever level is required to provide a satisfactory communication channel. As the power level of a particular mobile transmitter operating on a given frequency in a particular cell is reduced, the power level of a particular mobile transmitter operating on the same frequency in an adjacent cell may be increased, and vice versa. This allows the various operating frequencies of adjacent cells to be used with optimum efficiency.

Several techniques have been developed in the past for controlling the output power of an RF power amplifier. One example is disclosed in U.S. Pat. No. 4,523,155, invented by Walczak, et al. and issued Jun. 11, 1985. The circuit of Walczak, et al. varies the output power of an RF power amplifier in response to a plurality of control signals referred to as Automatic Output Control (AOC) signals. This invention further includes temperature compensation means so that the circuit can be predictably operated over a wide range of temperatures. While this invention is presumably useful, it is quite complex, and it requires a number of additional components to provide the temperature compensation feature. Whenever additional components are incorporated in an electronic circuit, its reliability is necessarily reduced.

Another technique for controlling the output power of an RF amplifier is disclosed in U.S. Pat. No. 4,602,218, invented by Vilmur, et al. and issued Jul. 22, 1986. The circuit invented by Vilmur, et al. also provides a plurality of output power levels in response to a plurality of AOC signals and it is designed to operate in the same type of system as the circuit of Walczak et al. Both the Walczak, et al. and Vilmur, et al. inventions employ a diode rectifier to derive a feedback signal for controlling the power level of the RF amplifier output stage. While the circuit of Vilmur, et al. is apparently less complex than the circuit of Walczak, et al., it provides an improvement over the Walczak invention by compressing the dynamic range of the feedback signal prior to the signal's application to the diode rectifier. According to Vilmur, et al., this dynamic range compression eliminates the need for specific temperature compensation circuits. However, the circuit of Vilmur, et al. employs a logarithmic amplifed with a non-linear gain function to achieve this result. While the circuit of Vilmur, et al. may achieve its stated purpose, the performance of non-linear systems are difficult to predict under all conditions and maybe prone to instability in many instances. Furthermore, the circuit invented by Vilmur, et al. is also relatively complex, requiring a compression or dynamic range reduction circuit to achieve its stated purpose. Each of the references mentioned above is incorporated herein by reference.

SUMMARY OF THE INVENTION

Briefly described, the present invention contemplates an RF amplifier control circuit which enables the RF amplifier to output an amplified RF signal at a selected one of a plurality of output power levels in response to a plurality of input control signals. The RF amplifier includes a gain control input which is responsive to the control circuit. The control circuit includes detector means coupled to the RF amplifier output which generates a DC output signal which is substantially linearly related to the magnitude of the RF signal output by the RF amplifier. Attenuator means are provided for attenuating the output RF signal a selected amount such that the attenuated RF signal input to said detector means has a dynamic range that is substantially within the temperature invariant range of said diode detector means. A means coupled to the input control signals selects one of a plurality of amplification factors in response to the input control signals. An amplifying means amplifies the DC output signal by the selected amplification factor and the amplified output signal is coupled to the gain control input of the RF amplifier.

More specifically, the present invention includes a variable gain amplifier which is responsive to a power level control signal. A directional coupler is coupled between the output of the variable gain amplifier and the output of the amplifier system. The RF signal is coupled through the primary coupling of the coupler. The output of secondary coupling of the directional coupler is coupled to a plurality of attenuators whose outputs comprise first and second RF feedback signals. A diode detector means generates a DC output signal of a selected one of said feedback signals by means of a switching means which is responsive to a first control signal. The DC output signal of the diode detector means is coupled to the inverting input of an error amplifier. The output of the error amplifier is coupled to the power level control input of the variable gain amplifier. The non-inverting input of the error amplifier is coupled to a reference voltage generated by a digital-to-analog (DAC) converter. Preferably the DAC is a four step converter for selectively generating one of four discrete output voltage levels. The four step digital-to-analog converter is controlled by second and third control signals. The present invention provides relatively low or high power modes by selecting one of two RF signal attenuators with the first control signal. Within each of these modes, four discrete power levels are selected by altering the output voltage of the DAC with the second and third control signals. Therefore, eight discrete power levels are provided. Since the RF signal rectified by the diode detector means is limited to a dynamic range wherein the diode detector means V-I characteristic is substantially linear, the need for temperature compensation is eliminated.

Accordingly, it is an object of the present invention to provide a gain control circuit for an RF amplifier which provides a plurality of output power levels.

It is another object of the invention to provide a gain control circuit for an RF amplifier which provides a plurality of output levels and which eliminates the need for add it temperature compensation circuitry.

It is still another object of the present invention to provide a gain control circuit for an RF amplifier which provides a plurality of output power levels and which eliminates the need for additional signal compression or non-linear dynamic range reduction circuitry.

BRIEF DESCRIPTION OF THE DRAWINGS

These and other advantages of the present invention may be appreciated from studying the following detailed description together with the drawings in which:

FIG. 1 is a block diagram of a first embodiment according to the present invention;

FIGS. 2a through 2f are a series of graphs used to explain the advantages of the present invention;

FIG. 3 is a block diagram of a preferred embodiment of the present invention;

FIG. 4 is a block diagram of another embodiment of the present invention;

FIG. 5 is an embodiment of the present invention which employs a modified switching scheme; and FIG. 6 is an embodiment of the present invention which employs a programmable power level control.

DETAILED DESCRIPTION OF THE INVENTION

Referring now to FIG. 1, there is shown an RF power amplifier control system 100 which provides a plurality of output power levels and which may be used for the same purpose as the RF power amplifier control system disclosed in the Walczak, et al. reference. The RF power amplifier system 100 shown in FIG. 1 is adapted to receive a relatively low level RF signal at terminal 102. Terminal 102 is coupled to a variable gain RF power amplifier 104 which amplifies the signal present at terminal 102 to a desired amplitude and outputs this amplified RF signal on an output lead 107. The gain of variable gain amplifier 104 is controlled by the output of DC error amplifier 110 which is coupled to RF power amplifier 104 through control lead 112. The RF power amplifier 104 suitably may be of a type such as the Toshiba SAU-30 or NEC 5313A. Alternatively, the RF power amplifier 104 may be the same type of power amplifier described in the referenced cited above.

A conventional directional coupler 105 includes a primary coupling 106 having an input end connected with output lead 107 of power amplifier 104, and an output end coupled to the system output terminal 108. An isolated secondary coupling 113 provides a feedback RF signal on signal line 114 at a power level of −10 dB. The feedback RF signal on signal line 114 is rectified by diode detector means 116 to provide a DC feedback signal for error amplifier 110. A suitable diode detector is the NEC 1SS97 or its functional equivalent The magnitude of the feedback signal is controlled by attenuating means 117, comprising in this embodiment resistors 118 and 120, selected by RF signal switching means 122 which is controlled by control lead 124. The attenuating means 117 provide linear or stepwise attenuation of the RF feedback signal. Thus, the feedback signal 114 is linearly attenuated to two discrete levels, a relatively high power mode and a relatively low power mode, by the two resistors 118 and 120, respectively.

Control lead 124 is coupled to terminal 126 and is adapted to switch the switching means 122 with a logic level signal A coupled to terminal 126. This logic level control signal corresponds to a first Automatic Output Control (AOC) signal. A number of techniques may be used to fabricate switching means 122 For example, switch means 122 may suitably comprise a relay, an FET or bipolar switching transistor or a PIN diode. A suitable PIN diode is the HP 6419-52. A suitable relay is the OMRON G5Y-154P. Therefore, the output power of the circuit 100 may be switched between relatively high and relatively low power modes based on the logic level signal appearing at terminal 126.

A standard DC buffer amplifier means 119 is preferably provided according to well known techniques for buffering the DC output of detector 116. The non-inverting input of DC buffer amplifier means 119 is connected to the output lead of detector means 116. The inverting input of buffer amplifier means 119 is connected to ground. A conventional negative feedback loop is also provided between the inverting input of amplifier 119 and its output lead.

An error amplifier means 110 is provided for amplifying the DC output signal, as output by DC buffer amplifier 119, as a function of a voltage reference signal composed of one of a plurality of selected amplification factors, as will be explained below. Preferably, amplifier means 110 is a DC error amplifier having an inverting input lead connected to the output lead of DC buffer amplifier 119 and a non-inverting input lead 127 connected to the output of a four step digital-to-analog converter means 128. The digital-to-analog converter means functions to selectively generate said one of a plurality of amplification factors.

The output of digital-to-analog converter 128 is suitably controlled by second and third logic level AOC signals B and C appearing at terminals 130 and 132 respectively. The logic level signals appearing at terminals 126, 130 and 132, may be suitably identical to the automatic output control (AOC) signals referred to in the prior art references mentioned above. Depending on the particular state of the AOC signals appearing at terminals 130 and 132, the output of the four step digital to analog converter 128 may be switched between four discrete voltage levels which may be adjusted by resistors 134, 136, 138 and 140, respectively. Therefore, digital-to-analog converter 128 may be selectively caused to output any one of four output voltage reference levels thus providing four discrete power levels in the output of error amplifier I/O in both the relatively low and relatively high power modes. In total, eight discrete power levels are thus provided by amplifier 110, by selectively controlling the AOC logic level signals at terminals 126, 130 and 132. Bias for resistors 134, 136, 138 and 140 is provided by a DC voltage appearing at terminal 142.

The circuit 100 provides improved performance over prior art circuits by eliminating the need for temperature compensation or complex non-linear signal processing schemes. This feature can be appreciated by referring to FIGS. 2A through 2F.

Referring now to FIG. 2A, it is known that a diode conducting in the active region exhibits a voltage-to-current characteristic which is substantially linear within a pre-defined range. However, outside this range the voltage-current characteristic of the diode is substantially non-linear and highly temperature dependent. A diode voltage-current characteristic is shown in both curves A and B of FIG. 2A. The solid portion of curves A and B represent linear conduction region and the dotted of curves A and B represent the non-linear region of the diode. In prior art systems in which a diode detector is operated over its entire operating range, circuitry must be added to compensate for such temperature dependent non-linear characteristics.

It will be appreciated that the present invention provides a significant advantage over the prior art because the present invention eliminates the need for temperature compensation circuitry by operating the diode detector means 116 only in the region where its voltage-current characteristic is substantially linear. This result is achieved, as seen in FIG. 2A, by attenuator means 117, which enables the same diode detector means 116 to operate in its linear conduction region for two different RF power dynamic ranges. Curve A, the low power range, is achieved when resistor 120 is selected by RF switch 122, and curve B, the high power range, is achieved when resistor 118 is selected by switch 122.

FIG. 2B illustrates how the two power ranges of curve A and curve B are expanded into a total of eight discrete power levels. Specifically, when resistor 120 is selected, the four step digital-to-analog converter 128 provides power levels 7 through 4. When resistor 118 is selected, the digital-to-analog converter 128 controls power levels 3 through 0. Throughout the entire power level control range the diode detector means current-to-voltage characteristic is maintained in its substantially linear range such that no temperature compensation is required.

This advantage of the present invention may be further understood by referring to FIGS. 2C through 2F. FIG. 2C is the representation the output signal generated by the switching means 122 wherein line A represents the RF output signal of switching means 122 which is input to diode 116 in the low power mode and line B represents the RF output of switching means 122 that is input to diode 116 in the high power output mode. FIG. 2D shows the output of the diode detector means 116 in each of the above-mentioned modes wherein the shaded areas on lines A and B represent the output of the diode detector means 116 in the temperature variant region. In the preferred practice of the present invention, the diode detector means 116 is not operated in a temperature variant region and the need for temperature compensation is thereby obviated.

As an example of the prior art, the invention disclosed in the Vilmur, et al. reference mentioned above, employs a logarithmic amplified to compress the dynamic range of the RF signal. The input/output response of the Vilmur circuit is shown in FIGS. 2E and 2F. Specifically, FIG. 2E shown the input to the detector diode means when it has been preamplified by a logarithmic type amplifier. As shown in FIG. 2E, the logarithmic amplifier is operated partly in a non-linear temperature dependent range such that a substantial portion of the logarithmic amplifier response is adversely affected by temperature variations. Since the diode detector will similarly be operating in a temperature variant region, the result is an excessive temperature dependency. Therefore, onerous temperature compensation circuitry appears to be required in this prior art device even if the diode detector means itself is operating in a substantially linear region. As mentioned above, the present invention avoids the problem by using a linear feedback signal derived by resistors 118 or 120, such that diode detector 116 is operated in a conduction region which is substantially independent of temperature.

Referring now to FIG. 3, an alternative preferred embodiment of the present invention is shown at 300. The directional coupler 105 of FIG. 1 is replaced with a dual directional coupler means 301. Dual directional coupler 301 has a primary coupling 306 having an input end connected with the output terminal 307 of an RF power amplifier 304 as in FIG. 1. The output end of the primary coupling 306 is connected to the system power output terminal 308. Two isolated secondary couplings 303 and 305 are disposed generally parallel to primary coupling 306. However, any convenient configuration of primary and dual secondary couplings may be utilized. All that is necessary is that the primary coupling 306 generate first and second RF signals representative of the amplified RF signal at each isolated secondary coupling means 303 and 305.

In a preferred embodiment, these secondary couplings 303 and 305 provide means for attenuating the RF signal generated thereon by the primary coupling 306. It will be appreciated that the dual secondary couplings provide the same linear attenuation of the RF signal as is provided by the resistive attenuators 118 and 120 in FIG. 1. That is, dual secondary couplings 303 and 305 provide signal output leads of approximately −24dB and −10d, respectively. These two levels correspond to the high and low power output modes.

The attenuated RF signals from secondary couplings 303 and 305 are each coupled to an input lead of diode detectors 311 and 312, respectively. Diode detectors 311 and 312 in a preferred embodiment comprise dual diode detectors such as the NEC 1SS97. These diode detectors have the same function as the diode 116 in the embodiment of FIG. 1. The rectified signals from diodes 311 and 312 are then each coupled through an associated DC buffer amplifier means 314 and 315, respectively, to a simple single pole double throw DC analog switch means 316. In a preferred embodiment, the DC analog switch means 316 may be an RCA CD4053 and the DC buffer amplifiers 314 and 315 may be of a type similar to the JRC LM2904. The DC analog switch means 316 has two input leads each connected to a respective output lead of buffer amplifiers means 314 and 315. Switch means 316 also has a third input lead provided for receiving an automatic output control (AOC) switching signal from terminal 326.

The output of the DC switch means 316 is applied to the inverting input lead of a DC error amplifier means 310. Amplifier means 310 provides a means for amplifying the output DC signal as a function of selected amplification factors. In a manner similar to that of FIG. 1, the four step digital to analog converter 328 has its output applied to the non-inverting input lead of DC error amplifier means 310. In a preferred embodiment, error amplifier 310 is a JRC LM2904. The output lead of error amplifier 310 is then applied to a control lead 312 of the RF power amplifier 304 in a similar manner as in FIG. 1.

With the exception of the use of the dual output directional coupler means 301 and the corresponding dual diode rectifiers 311, 312 each for receiving a corresponding one of the two signal levels from coupler 301, the operation of the circuitry 300 is substantially the same as the operation of circuit 100 as shown in FIG. 1. It will be appreciated that the diode detectors 311 and 312 are always operated in a linear operating region and the need for temperature compensation is thereby eliminated.

Referring again to FIG. 2A, for the circuit of FIG. 3 having dual diode detectors 311 and 312, curve A is the response of diode detector 312 having an RF signal of −10dB attenuation coupled to its input lead from secondary coupling 305. Response curve B in FIG. 2A is the representative curve when the −24dB attenuated RF signal is coupled to the detector 311.

FIG. 4 shows another embodiment of the present invention. A dual directional coupler 401 has two isolated secondary couplings 425 and 427 and a primary coupling 417. The primary coupling 417 is connected to the output lead of power amplifier 404. Secondary coupling 425 and secondary coupling 427 each has an output lead connected to an RF switch module 423. Switch module 423 includes a two state switch means 426 which may be a two position single throw switch. Switch means 426 has each one of the two leads connected to a corresponding isolated secondary coupling 425 and 427. Thus, one of two levels from the secondary coupling 425 and 427 is selected by the switch at the control module 423 as in the operation of FIG. 1. In other words, the resistive attenuators 118 and 120 of FIG. 1 are replaced in this embodiment by secondary couplings 425 and 427 which provide the necessary linear attenuation of the RF signal. The operation of this circuit is substantially the same as in FIG. 1.

More specifically, control load 424 is coupled to the switching module 423 and is adapted to provide the switching module 423 with logic level control signals generated at terminal 426. The logic level control signals on line 424 correspond to automatic output control (AOC) signals. A diode detector means 416 is provided for receiving the output signal from switching module 423 and a standard DC buffer amplifier means 419 is connected to the output lead of the diode detector means 416. An amplifier means 410 is provided for amplifying the DC output signal of DC amplifier 419 as a function of a voltage reference signal composed of one of a plurality of selected amplification factors provided by the digital to analog convertor means 428. The digital to analog converter means 428 functions is a manner similar to FIG. 1 to selectively generate one of a plurality of amplification factors. Depending on the particular state of AOC signals appearing at terminals 430 and 432, the output of the four step digital to analog converter means 428 may be switched between four discrete levels which may be adjusted by resistors 434, 436, 438 and 440, respectively. Bias for resistors 434, 436, 438 and 440 is provided by a DC voltage appearing at terminal 442. In total, eight discrete power levels are provided by selectively controlling the AOC logic levels signals at terminals 426, 430 and 432.

Referring now to FIG. 5, an RF amplification system 500 is provided for generating a plurality of discrete power amplification signals. The operation of this circuit is similar to the circuit of FIG. 1. A directional coupler 506 has a secondary coupling 513 for generating an RF signal representative of the output RF signal on lead 514. The RF signal on lead 514 is then coupled with a plurality of serially connected discrete attenuator means 517. Each attenuator means 517A, 517B and 517C includes an associated RF switch means 522A, 522B and 522C. The RF switch means 522 may be a PIN diode such as HP 6419-52, or may comprise a relay such as OMRON G5Y-154P. Each RF switch means 522A, 522B and 522C is disposed for separate selective shorting of independently selecting its corresponding attenuator means 517A, 517B and 517C. Each attenuator means 517 provides a different power level. In a preferred embodiment, attenuator means 517A provides an RF signal attenuation of −16dB; attenuator means 517B provides an RF signal attenuation of −8dB; and attenuator 517C provides an RF signal attenuation of −4dB. Each RF switch means 522 associated with one of the corresponding attenuator means 517 also is adapted for receiving one of a plurality of control signals, corresponding to digital automatic output control signals, on lines A, B and C. It will be appreciated that the switch means associated with each corresponding attenuator means are used to provide eight levels of RF signal attenuation as shown in the table of FIG. 5. Thus, this circuit enables selective attenuation of the RF signal to enable the dynamic range thereof to be within the temperature invariant range of said diode detector means 516 over a large RF signal power level range. Error amplifier 510 is thus not required to have a plurality of amplification factors fed thereto, just a single voltage reference generated in a conventional range, as by use of a voltage divider circuit as shown, using resistors 538 and 540 coupled between a DC bias voltage on terminal 542 and ground. The output of amplifier 510 is fed on line 512 to the power level control input of RF power amplifier 504.

Referring now to FIG. 6, a further embodiment of the invention includes a programmable power level control circuit 600 which, in operation, is similar to the embodiment of FIG. 3 with the exception that the switching means 616 for selecting the one of two levels is controlled by a microprocessor 660, such as the Hitachi model HD 6303X. The DC reference voltage for the error amplifier 610 may be generated by a digital to analog converter 628, such as the AD 7528 from Analog Devices. Alternatively, the reference voltage for error amplifier 610 may be generated by a digital trimpot (Astec part no. 221-00000077). The DC output from the digital to analog converter 628 for digital trimpot can be programmed directly by the microprocessor 660. The microprocessor 660 is preferably connected to a nonvolatile memory 670 for nonvolatile retention of data comprising the current switch state of switch 616 and converter 628.

As in FIG. 3, because the RF power input to the diode detectors 611 and 612 is attenuated and maintained to within a predetermined dynamic range by each of the corresponding secondary couplings 603 and 605 of dual directional coupler 601, temperature compensation is not required.

The foregoing describes an improved linear power level control amplifier. The present invention eliminates the need for temperature compensation by using simple resistors or secondary couplings to provide selective binary attenuation of the feedback RF signal, as opposed to logarithmic amplifier type dynamic range compressors used in prior designs. In this manner a diode detector may be operated in a substantially linear region and the need for temperature compensation is eliminated. The present invention provides an improved and reliable means for controlling the power level with an RF amplifier with substantially simpler circuitry than employed in prior designs. Accordingly, other uses and modifications will be apparent to a person of ordinary skill in the art and all of such uses in modifications are intended to fall within the scope of the present invention.

What is claimed is:

1. An RF amplification system for generating a plurality of discrete power amplification levels for an RF signal comprising:
    a variable gain power amplifier means for generating an amplified RF signal at an output thereof and having a gain control input lead and an input lead for receiving said RF signal;
    detector means for generating an output DC signal as a function of an RF signal input to said detector means;
    coupling means connected to said output of said variable gain power amplifier means for generating first and second RF signals representative of said amplified RF signal, including first and second attenuator means, for causing said first and second RF signals to be attenuated a selected amount, respectively, such that the dynamic range of each said first and second RF signal is substantially in a temperature invariant range of operation of said detector means;
    switch means for enabling said detector means to generate said output DC signal as a function of a selected one of said first and second RF signals;
    means for selectively generating one of a plurality of amplification factors and;
    amplifier means for amplifying said output DC signal as a function of said selected amplification factor, said amplified output DC signal coupled to said gain control input lead of said variable gain power amplifier means.

2. An apparatus according to claim 1 wherein said means for selectively generating one of a plurality of amplification factors includes a digital to analog converter having at least two input for receiving digital control signals and an output lead connected to said amplifier means, the output lead of said converter selectively outputting one of a plurality of discrete voltage levels to said amplifier means as a function of the state of said control signals.

3. An apparatus according to claim 1 wherein said means for selectively generating one of a plurality of amplification factors includes a digital to analog converter for converting an input digital control signal to a selected one of a plurality of discrete voltage levels, said selected voltage level comprising said selected generated amplification factor.

4. An apparatus according to claim 1 wherein said coupling means comprises a directional coupler including a primary coupling through which said amplified RF signal is coupled and an isolated secondary coupling, said secondary coupling generating a feedback RF signal representative of said amplified RF signal, and wherein said switch means comprises an RF switch means for coupling said feedback RF signal to a selected one of said first and second attenuator means as a function of an input control signal, and wherein said first and second attenuator means comprise first and second resistors respectively, each said resistor having an input lead connected to said switch means and an output lead, and means for coupling each said output lead in common to the input of said detector means.

5. An apparatus according to claim 1 wherein said coupling means comprises a directional coupler including a primary coupling through which said amplified RF signal is coupled, said first and second attenuator means comprising first and second isolated RF secondary couplings of said directional coupler each for providing a linear attenuation of said amplified RF signal; and
    wherein said switch means comprises a two state switch having a first input lead connected to said first attenuator means and a second input lead connected to said second attenuator means, and having a control lead and an input lead, said switch means for outputting to said detector means on said output lead a selected one of said first or second RF signals in response to a control signal received on said control lead.

6. An RF amplification system for generating a plurality of discrete power amplification for an RF signal comprising:
    variable gain amplifier means for generating an amplified RF signal at an output thereof and having a gain control input lead for receiving said RF signal;
    coupling means connected to said output of said variable gain amplifier means for generating first and second RF signals representative of said amplified RF signal including first and second attenuator means for selective linear attenuation of said first and second RF signals, respectively;
    first and second detector means, each detector means for generating an output DC signal as a function of a respective first and second RF signals;
    switch means operatively connected to said first and second detector means for enabling a selected one of said output DC signals to be output as said selected output DC signal;
    means for selectively generating one of a plurality of discrete amplification factors, each amplification factor being representative of a desired power amplification level; and
    amplifier means for amplifying said selected output DC signal as a function of said selected amplification factor, said amplified DC signal coupled to said gain control input lead of said variable gain amplifier means.

7. An RF amplification system according to claim 6 including means for buffer amplifying each said DC signal output by said first and second detector means.

8. An apparatus according to claim 6 wherein said coupling means comprises a directional coupler including a primary coupling through which said amplified RF signal is coupled, said first and second attenuator means comprising first and second isolated RF secondary couplings of said directional coupler each for providing a linear attenuation of said amplified RF signal, and wherein said first and second detector means are coupled, respectively, to said first and second isolated secondary couplings for producing first and second output DC signals from said attenuated RF signals.

9. An apparatus according to claim 8 wherein said switch means comprises a DC switch having a first input lead connected to the output of said first detector means and having a second input lead connected to the output of said second detector means, and having an output lead and a control lead, said switch means for selectively outputting on said output lead said first DC signal from said first detector means or said second DC signal from said second detector means in response to a control signal received on said control lead.

10. An apparatus according to claim 9 wherein said means for selectively generating one of a plurality of amplification factors includes a digital to analog converter for converting an input digital control signal to a selected one of a plurality of discrete voltage levels, said selected voltage level comprising said selected generated amplification factor.

11. An RF amplification system for generating a plurality of discrete power amplification levels for an RF signal comprising:

variable power amplifier means for generating an amplified RF signal at an output thereof and having a power level control input lead and an input lead for receiving said RF signal;

coupling means connected to said output of said variable power amplifier means for generating an RF signal representative of said amplified RF signal;

detector means for generating an output DC voltage as a function of an input RF signal;

a plurality of linear attenuator means connected in series for generating said input RF signal by selectively attenuating said generated RF signal such that said input RF signal is substantially in a temperature invariant range of operating of said detector means, including means associated with each one of said attenuator means for selectively shorting said associated attenuator means as function of an input control signal; and amplifier means for amplifying said output DC signal, said amplified DC signal coupled to said power level control input lead of said variable gain amplifier means.

12. An apparatus according to claim 11 wherein said coupling means comprises a directional coupler including a primary coupling through which said amplified RF signal is coupled and an isolated secondary coupling, said secondary coupling generating said RF signal representative of said amplified RF signal.

13. An RF amplification system for generating a plurality of discrete power amplification levels for an RF signal comprising:

a variable gain power amplifier means for generating an amplified RF signal at an output thereof and having gain control input lead and an input lead for receiving said RF signal;

means connected to said output of said variable gain amplifier means for generating first and second RF signals representative of said amplified RF signal, including first and second isolated coupling means for attenuation of said generated RF signals, such that each said attenuated signal is substantially in a temperature invariant range of operation of said detector means;

first and second detector means for generating first and second output DC signals from said first and second RF signals respectively, a DC switch having a first input lead for receiving said first DC signal and a second input lead for receiving said second DC signal and having a control lead and an output lead such that a selected DC power level is output in response to control signals on said control lead;

microprocessor means having a control lead operatively connected to said switch means for enabling a selected one of said first and second DC signals to be output as a selected output DC signal, and for selectively generating one of a plurality of amplification factors; and amplifier means for amplifying said selected output DC signal as a function of said generated amplification factor, said amplified selected output DC signal coupled to said gain control input lead of said variable gain amplifier means.

14. An apparatus according to claim 13 wherein said first and second detector means comprises first and second rectifier means, respectively, each connected for rectifying said corresponding first and second attenuated RF signals.

* * * * *